United States Patent
Zhong et al.

(10) Patent No.: US 7,022,596 B2
(45) Date of Patent: Apr. 4, 2006

(54) METHOD FOR FORMING RECTANGULAR-SHAPED SPACERS FOR SEMICONDUCTOR DEVICES

(75) Inventors: Huicai Zhong, Wappingers Falls, NY (US); Srikanteswara Dakshina-Murthy, Wappingers Falls, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 105 days.

(21) Appl. No.: 10/747,680

(22) Filed: Dec. 30, 2003

(65) Prior Publication Data

US 2005/0146059 A1    Jul. 7, 2005

(51) Int. Cl.
*H01L 21/3205* (2006.01)

(52) U.S. Cl. .................. 438/595; 257/336; 257/408; 257/411; 438/261; 438/287; 438/303; 438/305; 438/778

(58) Field of Classification Search ............... 257/336, 257/408, 411; 438/261, 287, 303, 305, 778
See application file for complete search history.

(56) References Cited

U.S. PATENT DOCUMENTS

| 4,488,351 | A | 12/1984 | Momose |
| 6,004,851 | A | 12/1999 | Peng |
| 6,323,519 | B1 * | 11/2001 | Gardner et al. ............. 257/336 |
| 6,440,875 | B1 * | 8/2002 | Chan et al. ................. 438/778 |
| 2002/0140100 | A1 | 10/2002 | Yokoyama |
| 2003/0045061 | A1 | 3/2003 | Lin et al. |
| 2003/0227054 | A1 | 12/2003 | Saiki |

* cited by examiner

Primary Examiner—Mai-Huong Tran

(57) ABSTRACT

A semiconductor device and method of making the same forms a spacer by depositing a spacer layer over a substrate and a gate electrode and forms a protective layer on the spacer layer. The protective layer is dry etched to leave a thin film sidewall on the spacer layer. The spacer layer is then etched, with the protective layer protecting the outer sidewalls of the spacer layer. This etching creates spacers on the gate that have substantially vertical sidewalls that extend parallel to the gate electrode sidewalls. The I-shape of the spacers prevent punch-through during the source/drain ion implantation process, providing an improved source/drain implant dose profile.

11 Claims, 3 Drawing Sheets

METHOD FOR FORMING RECTANGULAR-SHAPED SPACERS FOR SEMICONDUCTOR DEVICES

FIELD OF THE INVENTION

The present invention relates to the field of semiconductor processing, and more particularly, to the formation of spacers and source/drain formation in semiconductor devices.

BACKGROUND OF THE INVENTION

In the formation of semiconductor devices, it is desirable to create spacers on the sidewalls of a gate to serve as masks during source/drain implantation. An exemplary spacer formation process and implantation process is depicted in FIGS. 1–3 described below.

In FIG. 1, a substrate 10 has a gate 12 formed thereon. The gate 12 may be a polysilicon gate, for example. Source/drain extension regions 16 are formed, by ion implantation, for example, employing the gate 12 as an implantation mask. A spacer layer 14 is deposited by any suitable method, such as chemical vapor deposition. The spacer layer may be made of any suitable material, such as silicon nitride, silicon oxide, low-k dielectric materials, etc.

An isotropic etching is performed, the results of which are depicted in FIG. 2. The isotropic etching creates "D"-shaped spacers 18 that extend from the sidewalls of gate 12. The spacers 18 form a mask, along with the gate 12, for performing a source/drain implantation process. It is desirable to space the deep source/drains from the gate 12 in order to reduce short channel effects. An ion implantation process, as indicated by arrows 20, is employed to create the deep source/drain implants. However, as will be recognized by the configuration of the D-shaped spacers 18 in FIG. 2, the outer regions of the D-shaped spacers 18 have a relatively thin profile at the outer edges. This allows some "punch-through" of the ions during the deep source/drain implantation process, which is a relatively high-energy process.

The consequences of the punch-through due to the thin profile of the spacers 18 is depicted in FIG. 3. An impressive control of the location of the deep source/drain implants creates the formation of source/drain regions 22 that extend underneath the spacers 18 to the area indicated by 24. This is further than the desirable region indicated by 26 in FIG. 3. Hence, the channel has been undesirably shortened due to the punch-through of the D-shaped spacers 18 during the source/drain implantation process.

Another disadvantage of the D-shaped spacers 18 is the worsening of conformity for further film deposition, necessary in such processes as the formation of a double spacer or the forming of an interconnect layer dielectric. The sloping nature of the outer shape of the spacers reduces conformity in subsequent film depositions.

SUMMARY OF THE INVENTION

There is a need for a method of forming a spacer and a semiconductor device that provides for increased control of the source/drain implantation process, as well as improving conformity for further film deposition.

These and other needs are met by embodiments of the present invention which provide a method of forming a spacer comprising the steps of depositing a spacer layer over a substrate and a gate electrode having a top surface and vertically extending sidewalls, and forming a protective layer on the spacer layer. The protective layer is etched to remove the protective layer from the spacer layer over the top surface of the gate electrode and maintain the protective layer on the spacer layer parallel to the sidewalls of the gate electrode. The spacer layer is etched to remove the spacer layer from the substrate and over the top surface of the gate electrode to form spacers on the gate electrode with each spacer having two substantially vertical sidewalls extending parallel to the gate electrode sidewalls.

By providing a protective layer on the spacer layer, the sidewall of the spacer is protected during the etching process, so that a substantially rectangular (I-shaped) spacer is formed. The spacer according to the present invention therefore does not have a thinner outer edge that makes the implantation profile difficult to control. Also, the relatively vertical outer wall of the spacer increases conformity for further film deposition, such as double spacer processes or interconnect layer dielectrics.

The earlier stated needs are also met by other embodiments of the present invention which provide a method of forming a semiconductor device comprising the steps of forming a gate electrode having vertically extending sidewalls on a substrate, and forming first sidewall spacers on the gate electrode. Each first sidewall spacer has a pair of vertically extending planar sidewalls that are substantially parallel to the gate electrode sidewalls. A source/drain implantation process is performed with the gate electrode and the first sidewall spacers masking the substrate.

The earlier stated needs are also met by other embodiments of the present invention which provide a semiconductor device comprising a substrate, a gate on the substrate with the gate having vertical sidewalls, and sidewall spacers. The sidewall spacers are on the gate sidewalls, and have a rectangular cross-section and extend vertically to greater than half the height of the gate. Ion implanted source/drain regions are provided that are defined by the sidewall spacers.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to the formation of spacers and the source/drain implantation dose profile in advanced CMOSFET device technology. In particular, the invention overcomes problems related to the relatively thinner outer edge of the spacer created in the prior art with a D-shape that allowed punch-through during the source/drain implantation process, degrading the control of the implant dose profile. The invention achieves improvement in the implant dose profiling during the source/drain implantation process by creating a substantially rectangular (I-shape) spacer on the gate and employing the spacer as a mask during the source/drain implantation process. Since the spacer of the present invention does not have a thinner region through which punch-through may occur, the invention provides a precise source/drain implantation dose profiling. A further advantage is the increased conformity provided due to the steep sidewalls, allowing for improved film deposition. This is an important advantage for deep sub-micron CMOSFET fabrications since a thinner film deposition may be used to form a second spacer due to the improved conformity. Larger spacers are therefore possible for devices with a smaller pitch.

Figure 4:
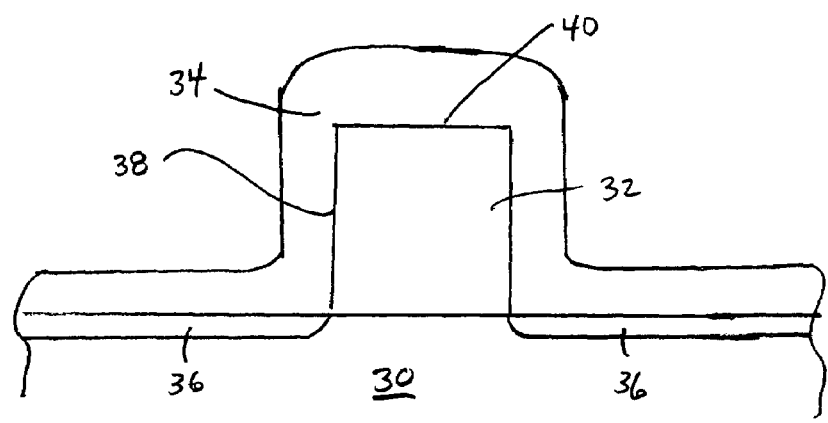
FIG. 4 is a schematic, cross-sectional view of a semiconductor device during one phase of manufacture in accordance with embodiments of the present invention, following the deposition of a spacer layer.

FIG. 4 is a schematic, cross-sectional view of a semiconductor device during one phase of manufacture in accordance with embodiments of the present invention. In FIG. 4, a substrate 30 has a gate electrode 32, such as a polysilicon gate, formed thereon by conventional techniques. A source/drain extension formation process is formed, employing the gate 32 as a mask to create source/drain extensions 36.

The gate 32 has sidewalls 38 and a top surface 40. The sidewalls 38 of the gate 32 are typically formed by a dry etching technique, such as reactive ion etching (RIE), and are substantially vertical and planar.

A spacer layer 34 is shown deposited on the substrate 30 and over the gate 32. The spacer layer 34 may be made of any suitable dielectric material, such as a nitride, an oxide, a low-k dielectric material, etc. The deposition may be by any suitable technique, such as chemical vapor deposition, for example. A suitable depth or thickness of the spacer layer 34 is provided, and is dependent upon the desired width of the spacers that will eventually be formed after etching of the spacer layer 34. In certain exemplary embodiments of the invention, the spacer layer is deposited to a thickness of between about 300 Å to about 800 Å.

Figure 1:
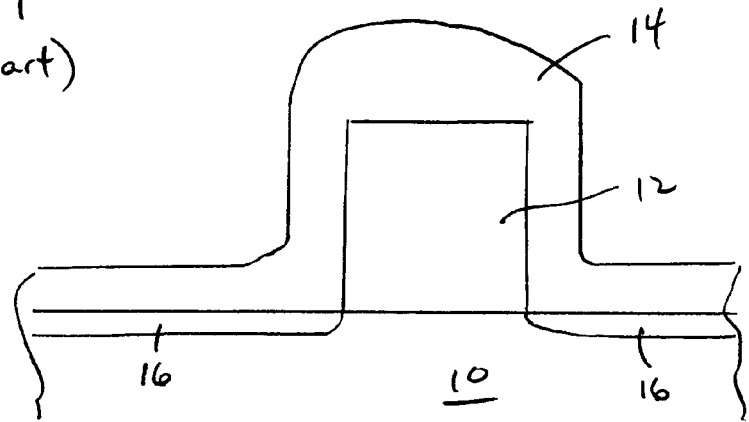
FIG. 1 is a schematic, cross-sectional view of a semiconductor device during one phase of manufacture in accordance with prior art methodology.
Figure 2:
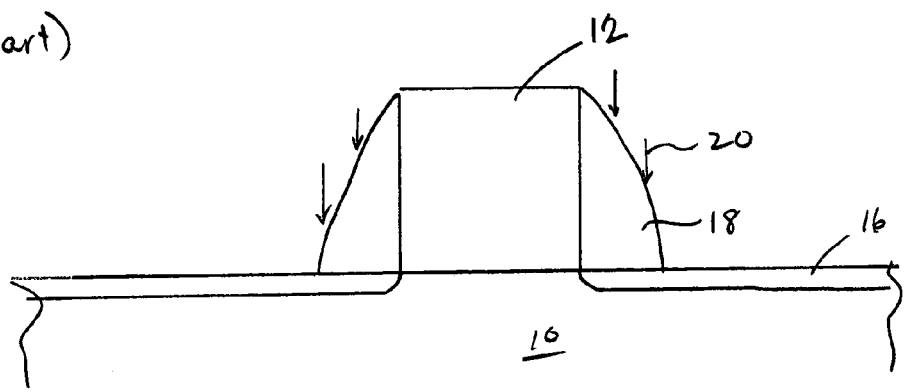
FIG. 2 depicts the structure of FIG. 1 following isotropic etching to form spacers in accordance with prior art methodologies.
Figure 3:
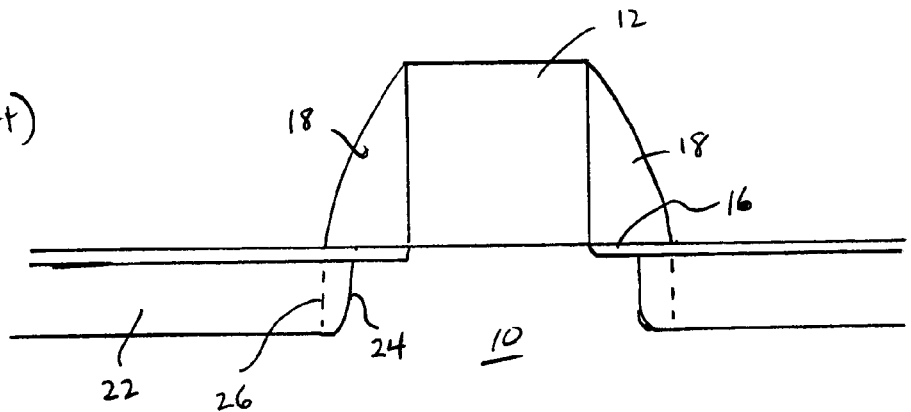
FIG. 3 shows the structure of FIG. 2 after a source/drain implantation process has been performed.
Figure 5:
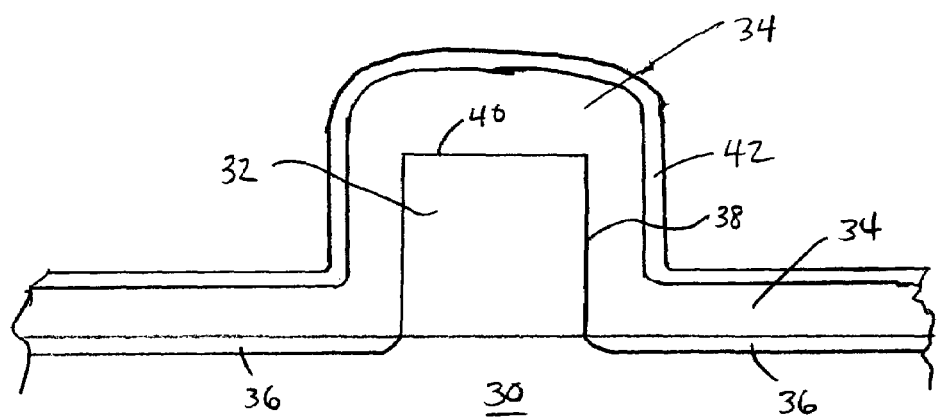
FIG. 5 shows the structure of FIG. 4 after the deposition of a protective layer on the spacer layer, in accordance with embodiments of the present invention.

In conventional techniques, the formation of the spacer layer 34 is followed by an isotropic etching to form D-shaped spacers, such as depicted in FIG. 2. The present invention, however, instead forms a protective layer 42, as shown in FIG. 5, that is conformally deposited on the spacer layer 34. The material of the protective layer 42 is different from the material forming the spacer layer 34. In particular, the material in the protective layer 42 should be such that it is not substantially etched when the spacer layer 34 is subjected to an etching by a particular etchant. In other words, during the etching of the spacer layer 34 to form spacers, an etchant should be used that is highly selective to the material in the spacer layer 34. When the spacer layer 34 is made of nitride, for example, a suitable material for the protective layer 42 is an oxide, for example. Further, the material of the protective layer 42 should exhibit good conformity.

The thickness of the protective layer 42 is much less than that of the spacer layer 34 in embodiments of the present invention. For example, a thickness of between about 10 Å to about 100 Å may be employed to provide an adequate protection to the sidewalls of the spacers that will be formed from the spacer layer 34, as will be seen. As the remainder of the protective layer 42 is removed and serves no purpose, only a thickness that provides a sufficient amount of protection to the sidewalls of the spacers formed from the spacer layer 34 is needed, so that a relatively thin protective layer 42 is desirable to reduce material costs and processing time.

Figure 6:
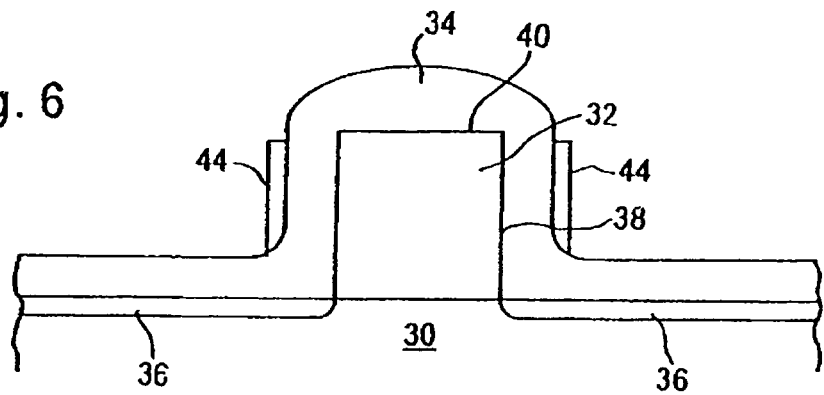
FIG. 6 depicts the structure of FIG. 5 following the etching of the protective layer in accordance with embodiments of the present invention.

FIG. 6 depicts the structure of FIG. 5 following an etching process to remove the protective layer 42 except along the vertically extending sidewalls of the spacer layer 34 that are parallel to the sidewalls 38 of the gate 32. These regions of the protective layer 44 are designated with reference numeral 44 in FIG. 6. The etching is a dry etching, such as a reactive ion etching. The portions of the protective layer 42 are removed except for the vertically extending regions 44. A conventional dry etching technique may be employed.

Figure 7:
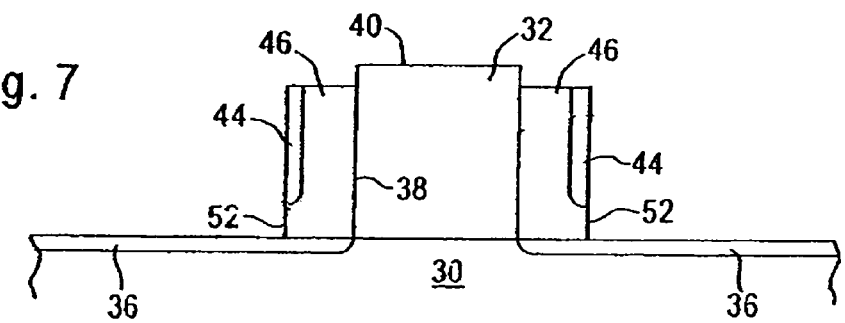
FIG. 7 shows the structure of FIG. 6 following the etching of the spacer layer in accordance with embodiments of the present invention.

FIG. 7 shows the structure of FIG. 6 after another etching has been performed to etch the spacer layer 34 and remove it from the substrate 30 and from over the top surface 40 of the gate electrode 32. This action forms spacers 46 on the gate sidewalls 38 of the gate 32.

During the etching process, which may be either a dry etch or an isotropic wet etch, the protective layer 44 on the outer sidewalls 52 of the spacers 46 protects the spacer layer material from being attacked during the etching process. Hence, vertical, or substantially vertical, outer sidewalls 52 of the spacers 46 are created. In cross-section, the spacers 46 exhibit a rectangular shape or "I-shape". The spacers 46 therefore do not present a thin outer region susceptible to punch-through during a source/drain implantation process.

Figure 8:
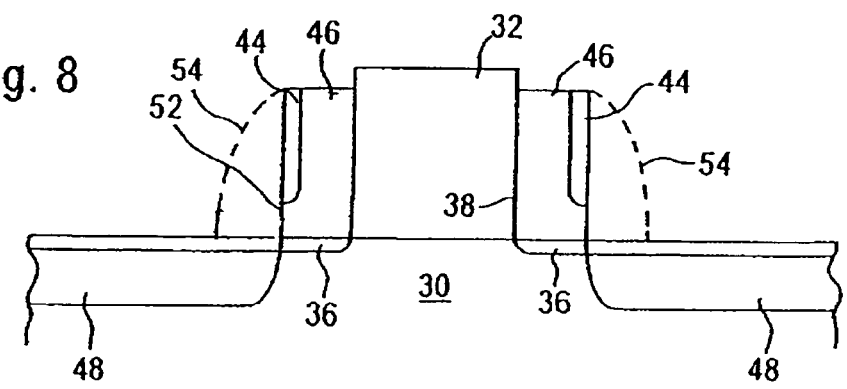
FIG. 8 depicts the structure of FIG. 7 during a source/drain implantation process performed in accordance with embodiments of the present invention.

A source/drain implantation process is performed, as shown in FIG. 8, to create source/drain regions 48. Because of the I-shape of the spacers 46, the source/drain implant dose profile is precise and does not extend underneath the outer edge of the spacers 46. Although the protective regions 44 are depicted in FIG. 8, this embodiment is exemplary only as in other embodiments, the protective regions 44 are removed as being unnecessary after the etching of the spacer layer 34. The lack of protective regions 44, which are very thin (such as 10 angstroms) in any event, does not have a noticeable effect on the doping profile achieved by the I-shaped spacers 46.

Due to the vertical nature of the outer sidewalls 52 of the first sidewall spacers 46, an improved conformity is provided for further film deposition, such as formation of a second sidewall spacer (shown as second sidewall spacers 54 in dashed lines in FIG. 8). Alternatively, conformity is also improved for other film depositions, such as interconnect layer dielectric material. Due to the increased conformity, a thinner film deposition for a second spacer formation may be employed. This makes larger spacers possible for devices with a smaller pitch.

The present invention thus provides a semiconductor device and method for making the same that exhibits a more controlled source/drain implant dose profile since there is no implantation penetration from the corner of the spacer, and also allows larger spacers for devices with smaller pitch.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming a semiconductor device comprising the sequential steps:
   forming source/drain extensions in a substrate;
   depositing a spacer layer over the substrate and a gate electrode having a top surface and vertically extending sidewalls;
   forming a protective layer on the spacer layer;
   etching the protective layer to remove the protective layer from the spacer layer over the top surface of the gate electrode and maintain the protective layer on the spacer layer parallel to the sidewalls of the gate electrode;
   etching the spacer layer to remove the spacer layer from the substrate and over the top surface of the gate electrode to form spacers on the gate electrode with each spacer having two substantially vertical sidewalls extending parallel to the gate electrode sidewalls; and
   performing a source/drain implantation with the gate electrode and the spacers masking the substrate.

2. The method of claim 1, wherein the spacer layer is deposited to a thickness greater than 200 Å.

3. The method of claim 2, wherein the protective layer is formed to a thickness between about 10 Å to about 100 Å.

4. The method of claim 3, wherein the spacer layer is a nitride and the protective layer is an oxide.

5. A method of forming a semiconductor device, comprising the sequential steps:
   forming a gate electrode having vertically extending sidewalls on a substrate;
   forming source/drain extensions in the substrate;
   forming first sidewall spacers on the gate electrode, each first sidewall spacer having a pair of vertically extending planar sidewalls that are substantially parallel to the gate electrode sidewalls; and
   performing a source/drain implantation with the gate electrode and the first sidewall spacers masking the substrate;
   wherein the step of forming first sidewall spacers includes:
   depositing a spacer layer over the substrate and the gate electrode after the forming of the source/drain extensions in the substrate;
   forming a protective layer on the spacer layer; and
   etching the protective layer and the spacer layer to form the first sidewall spacer.

6. The method of claim 5, wherein the step of etching includes dry etching the protective layer to remove the protective layer except for vertically extending portions of the protective layer that are planar and substantially parallel to the gate electrode sidewalls.

7. The method of claim 6, wherein the step of etching further includes etching the spacer layer to remove the spacer layer from the substrate and over a top surface of the gate electrode, leaving the spacer layer between the gate electrode sidewalls and the vertically extending portions of the protective layer.

8. The method of claim 7, further comprising forming a second sidewall spacer in the first sidewall spacer.

9. The method of claim 7, wherein the spacer layer is etched with an etchant that is highly selective to the spacer layer and does not substantially etch the protective layer.

10. The method of claim 9, wherein the spacer layer is deposited to a thickness of between about 200 Å to about 1000 Å.

11. The method of claim 10, wherein the protective layer is deposited to a thickness of between about 10 Å to about 100 Å.

* * * * *